United States Patent
Lin et al.

[11] Patent Number: 6,147,361
[45] Date of Patent: Nov. 14, 2000

[54] POLYSILICON ELECTROMIGRATION SENSOR WHICH CAN DETECT AND MONITOR ELECTROMIGRATION IN COMPOSITE METAL LINES ON INTEGRATED CIRCUIT STRUCTURES WITH IMPROVED SENSITIVITY

[75] Inventors: Chih-Sheng Lin; Shun-Yi Lee, both of Hsin-Chu, Taiwan

[73] Assignee: Taiwan Semiconductor Manufacturing Company, Hsin-Chu, Taiwan

[21] Appl. No.: 09/163,383

[22] Filed: Sep. 30, 1998

Related U.S. Application Data

[62] Division of application No. 08/796,351, Feb. 7, 1997, Pat. No. 5,846,848.

[51] Int. Cl.$^7$ ................................................. H01L 23/58
[52] U.S. Cl. ............................ 257/48; 257/528; 257/758; 257/773; 257/776
[58] Field of Search ................................ 438/11, 18, 10, 438/14, 17, 468, 629, 647, 927, 257, 324; 257/48, 528, 758, 773, 776, 754, 755, 756, 757, 66; 324/719, 158.1

[56] References Cited

U.S. PATENT DOCUMENTS

| | | | |
|---|---|---|---|
| 4,652,812 | 3/1987 | Gimpelson | 324/719 |
| 5,264,377 | 11/1993 | Chesire et al. | 438/11 |
| 5,426,375 | 6/1995 | Roy et al. | 324/769 |
| 5,627,101 | 5/1997 | Lin et al. | 438/18 |
| 5,801,394 | 9/1998 | Isobe | 257/48 |
| 5,846,848 | 12/1998 | Chih-Cheng et al. | 438/11 |

*Primary Examiner*—Matthew Smith
*Assistant Examiner*—Igwe U. Anya
*Attorney, Agent, or Firm*—George O. Saile; Stephen B. Ackerman

[57] ABSTRACT

A polysilicon sensor is described which can be incorporated onto a silicon wafer containing integrated circuits for the purpose of detecting and monitoring electromigration(EM) in metal test stripes representative of the interconnection metallurgy used by the integrated circuits. The sensor capitalizes on the property of silicon whereby a small increase in temperature causes a large increase in carrier concentration. In this regard, the local temperature rise of an adjacent metal line undergoing EM failure manifests itself as a decrease in resistance of the sensor. The sensor is particularly suited for testing multi-level metallurgies such as those having an aluminum alloy sandwiched between metallic layers such as those used for diffusion barriers and anti-reflective coatings. Its fabrication is compatible with conventional MOSFET processes which use a self-aligned polysilicon gate. It can be particularly useful when built into the wafer kerf area or into a manufacturing test site(MTS) where it can be used to qualify the metallization of a particular job. Structures built into the wafer kerf can be tested immediately after metallization while those built into MTS chips can be reserved for long term reliability testing.

11 Claims, 6 Drawing Sheets

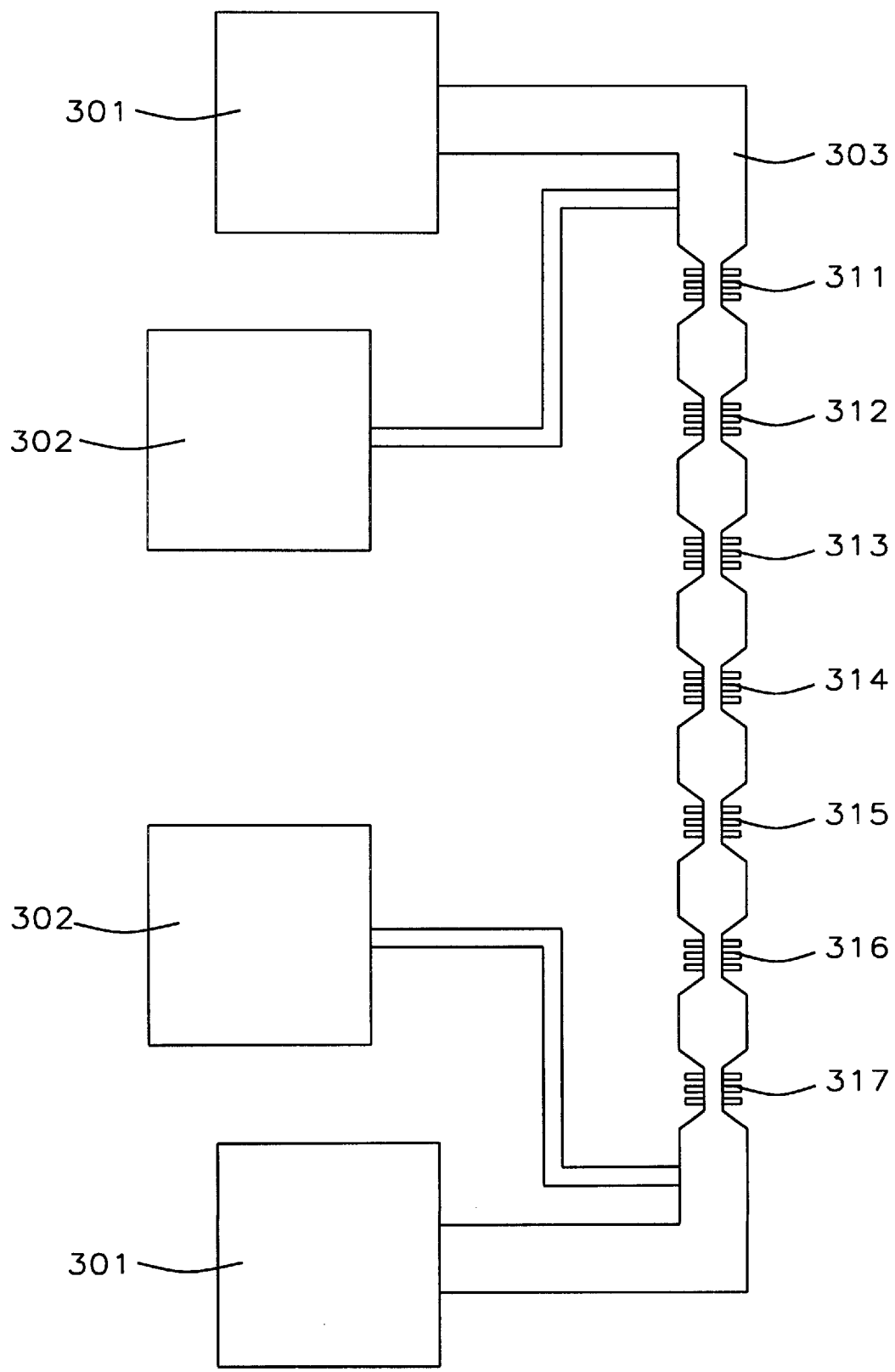
FIG. 1 - Prior Art

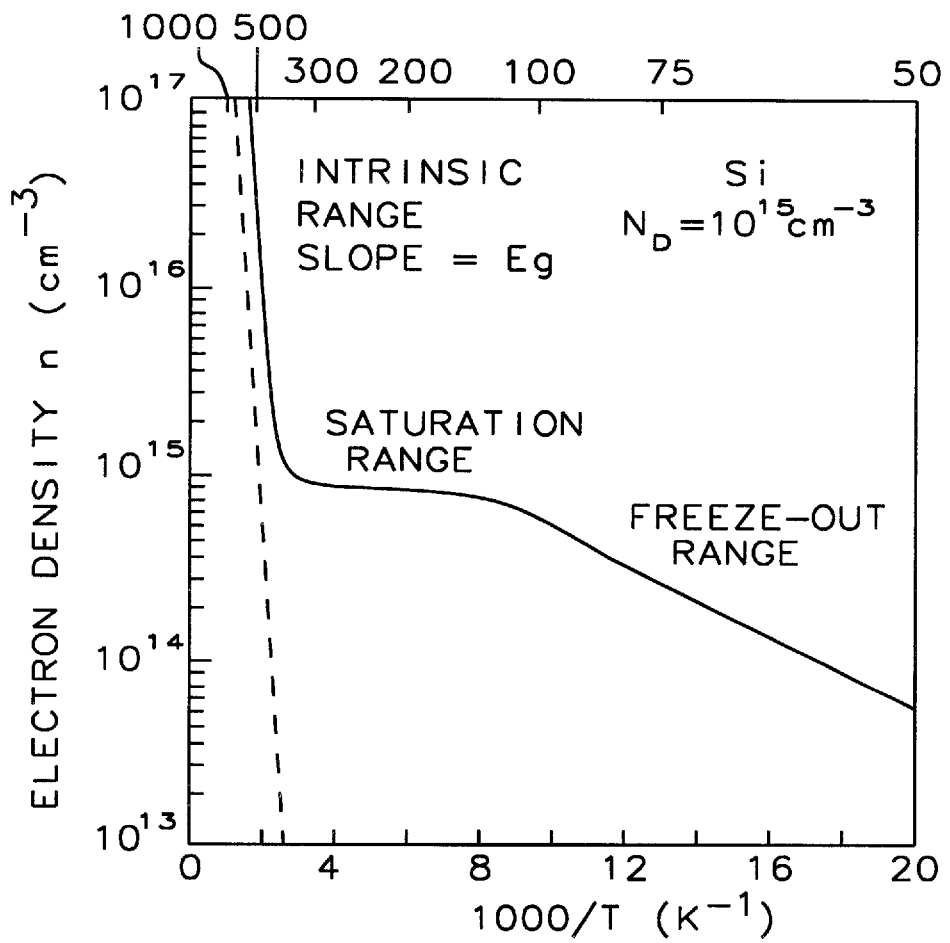
FIG. 2 - Prior Art
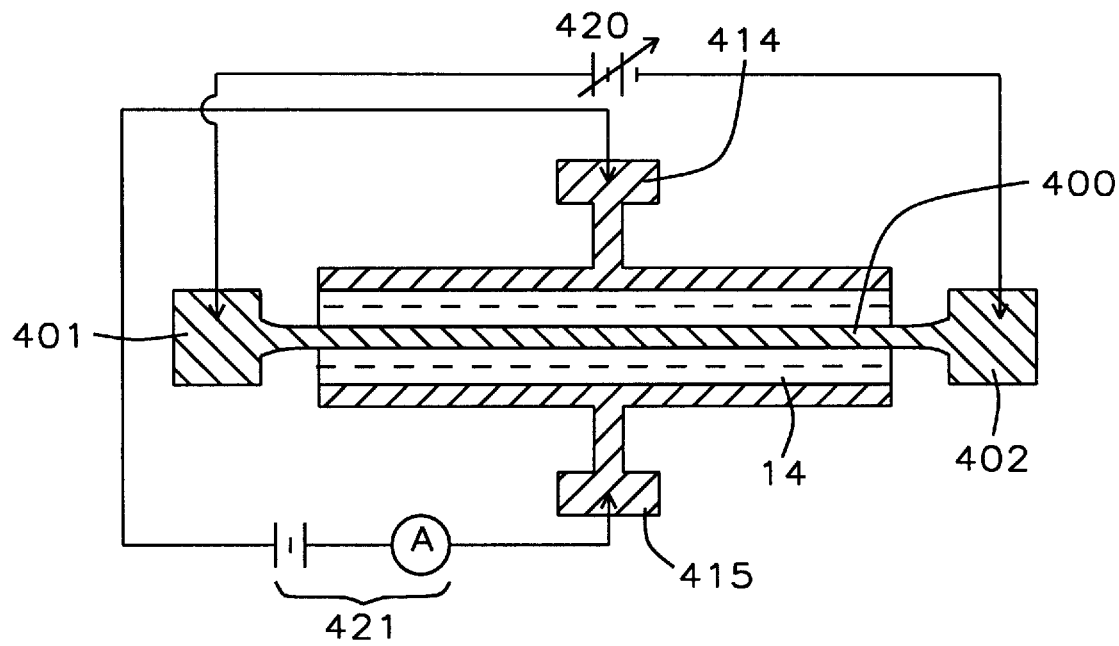
FIG. 3

POLYSILICON ELECTROMIGRATION SENSOR WHICH CAN DETECT AND MONITOR ELECTROMIGRATION IN COMPOSITE METAL LINES ON INTEGRATED CIRCUIT STRUCTURES WITH IMPROVED SENSITIVITY

This is a division of patent application Ser. No. 08/796,351, filing date Feb. 7, 1997 U.S. Pat. No. 5,846,818, A Polysilcon Electromigration Sensor Which Can Detect And Monitor Electromigration In Composite Metal Lines On Integrated Circuit Structures With Improved Sensitivity, assigned to the same assignee as the present invention.

BACKGROUND OF THE INVENTION

(1) Field of the Invention

This invention relates to processes for the manufacture of semiconductor devices and more particularly to a polysilicon test structure which can be used to detect and monitor the onset of electromigration in metal lines characteristic of integrated circuit interconnection metallurgy. The structure can be used for basic studies or it can be incorporated into a specially designed integrated circuit test chip and used as a highly sensitive line monitor.

(2) Description of prior art

The fabrication of integrated circuit chips involves the embedding of integrated circuit devices into a polished silicon wafer. The processes basically consist of device processing-wherein the semiconductor devices and field isolation regions are formed within the silicon surface, and device personalization wherein the wafer receives two or more levels of interconnection metallurgy, separated by insulation. The first layer of metallization is used to define small fundamental circuits, for example, a simple CMOS inverter containing two complimentary MOS field effect transistors(MOSFETs). Additional layers of metal lines are then provided to interconnect these primary circuits into larger units. A final layer of metallization is applied to connect the circuits to pads which form the chip's external connections. Connections between metal levels are made using metal filled via holes within an insulation layer.

Electromigration is a failure mechanism of these metal lines that has troubled integrated circuit technology since it's very beginnings in the 1960s. The earliest circuit devices were immense, compared to their present sizes. Similarly, the dimensions of the metal lines used to interconnect these devices were also much larger than they are today. The currents which these metal lines were required to carry often exceeded $1 \times 10^5$ amps/cm$^2$. In the bipolar technology of that day it was the emitter current that reached such levels. Failure of the emitter stripe, which was made of pure aluminum, began to occur after many hours of temperature/humidity testing. Metal within the stripe was physically swept along the stripe by the strong electron current in what was called the "electron wind". As the metal was swept away, sections of the stripe became thinner. This resulted in an increase in current density in that region accompanied by a local rise in temperature which further hastened the failure. The results of the accelerated life testing were later confirmed by emitter stripe failures in the field at longer time intervals. Statistical analysis of these results confirmed that the failures were truly a weakness of the aluminum metallurgy itself. The phenomenon was called electromigration (EM). The fix for the problem came quickly. The pure aluminum metallurgy was replaced with alloys of aluminum containing small amounts of silicon, copper, titanium, or tungsten. These alloys exhibited various degrees of inhibition of the metal drift.

Fortunately, as devices became smaller, operating voltages decreased somewhat and the current densities were kept in check with the assistance of better cooling. However, long term failure due to electromigration is still a major concern. In todays CMOS technology it is the power line current that causes electromigration failure exposure. The surface topology of the wafer has also become a concern with regard to metal line failures. Deposition of metal lines is commonly done by sputtering the metal from an aluminum alloy target. The presence of surface topological features in the areas where metal lines are deposited results in inadequate metal coverage. These features are often difficult to avoid. Metal lines frequently must traverse areas of underlying oxide field isolation regions which have ridges along their edges. Also lines crossing other lines on lower levels encounter dips and rises in topology. Local thinning of the metal lines over these features provide the weak spots for electromigration failures.

Consequently, various test structures have been designed to detect and monitor electromigration in susceptible circuits. One such structure, referred to by Chesire and Oates U.S. Pat. No. 5,264,377, is termed "SWEATS" (Standard Wafer-level Electromigration Acceleration Test). This structure is of the four-point-probe design(two pads for current application and two pads for voltage measurement) and consists of a metal stripe with multiple narrow regions (See FIG. 1). Testing is done by passing a larger than normal current (in excess of $1 \times 10^7$ amp/cm$^2$ through the stripe while measuring the voltage drop along it. The narrow sections quickly rise in temperature providing the heat to accelerate the test without harming the surrounding structures on the wafer. The test is quick and can be done as a spot check during wafer processing. Unfortunately the rapidity with which it is performed and the uncertainty of temperature, only allows it to be used as a spot check. Consequently correlation with long term stress testing is lacking. Chesire and Oates described a structure similar to the SWEATS structure but without the wide and narrow regions. It consists of a straight metal stripe, again with the fourpoint-probe feature, but also with additional metallization alongside the stripe to detect shorts, as well as transverse lines representing typical topography beneath the test stripe. This structure was basically designed for process monitoring purposes with quick turn-around times. It is driven by applied currents in excess of $1 \times 10^7$ amp/cm$^2$, and can give timely information for process adjustments within minutes. The design features more gradual temperature gradients, closer approximation to actual metallization geometries, and better correlation with long-term accelerated tests.

Recent advances in metal interconnection systems required by the trend towards miniaturization have made electromigration failure monitoring even more complex. The aluminum alloy lines are being fitted with adjacent thin layers of refractory metals and bimetallics consisting of titanium(Ti), titanium nitride(TiN), titanium-tungsten alloy (TiW), to name a few. These materials serve as diffusion barriers, adhesion promoters, anti-reflection coatings(ARC), and in other capacities that serve to improve bonding, lower contact resistance, and in general, improve the integrity of the overall interconnection system. For the purpose of this discussion, these layers will be referred to as barrier layers. The barrier layers can occur at one or both interfaces of the aluminum alloy. The aluminum alloy is still the primary current carrier but the adjacent barrier layers also participate in the process. The testing procedures which concern these composite metal lines must now also include these barrier layers. When electromigration occurs in such a structure, the barrier layers remain intact and the aluminum alloy, which is sandwiched between them fails. The standard methods and structures which measure the resistivity of the failing line become impractical because no sudden increase in resistivity occurs when the line fails.

This invention describes an electromigration sensor which is located adjacent to a composite EM test line and measures the local heating produced by the electromigration in the aluminum alloy.

SUMMARY OF THE INVENTION

The method for monitoring electromigration provided by this invention does not measure the metal line directly, but instead utilizes a polysilicon sensor element placed under the line, separated from it by a layer of silicon oxide. The polysilicon sensor is highly sensitive to thermal hot spots in the metal line. The sensor utilizes a property of silicon called the intrinsic region, wherein a small increase in temperature causes a large increase in carrier concentration. FIG. 2 depicts this temperature region occurring above about 3500C for silicon with a dopant concentration of $1\times10^{15}$ atoms/cm$^3$ (from S.M.Sze, "Physics of Semiconductor Devices", Wiley, N.Y. (1969),p.36). In this regard, a local increase in temperature of an adjacent metal line undergoing electromigration failure, manifests itself as a decrease in resistance of the sensor. In order to make effective use of the intrinsic property, undoped(less than $1\times10^{14}$ atoms/cm$^2$) polysilicon must be used for the sensor.

Fabrication of the sensor is compatible with current CMOS manufacturing processes utilizing self-aligned polysilicon gates. The sensor can be built into the wafer kerf area and tested prior to dicing or in can be built into a chip called a manufacturing test site(MTS). The MTS chip contains metal lines compatible with the sensor and fabricated at the same time as those of the product. In the photomask set, several MTS chips are placed within the array of product chips. Herein the sensors are deposited in the same step as the polysilicon gate. In this process sensors are provided only for test metal lines contained at the first metallization level. However, these lines are generally the smallest and the most susceptible to electromigration failure.

BRIEF DESCRIPTION OF THE DRAWINGS

FIG. 1 is a top view of a prior art structure used for measuring electromigration known as the SWEATS structure.

FIG. 2 is a graphical representation of electron density versus the inverse of absolute temperature for silicon.

FIG. 3 is a top view of the electromigration structure of the present invention along with a schematic representation of the probes and testing circuitry.

DESCRIPTION OF THE PREFERRED EMBODIMENTS

Figure 4:
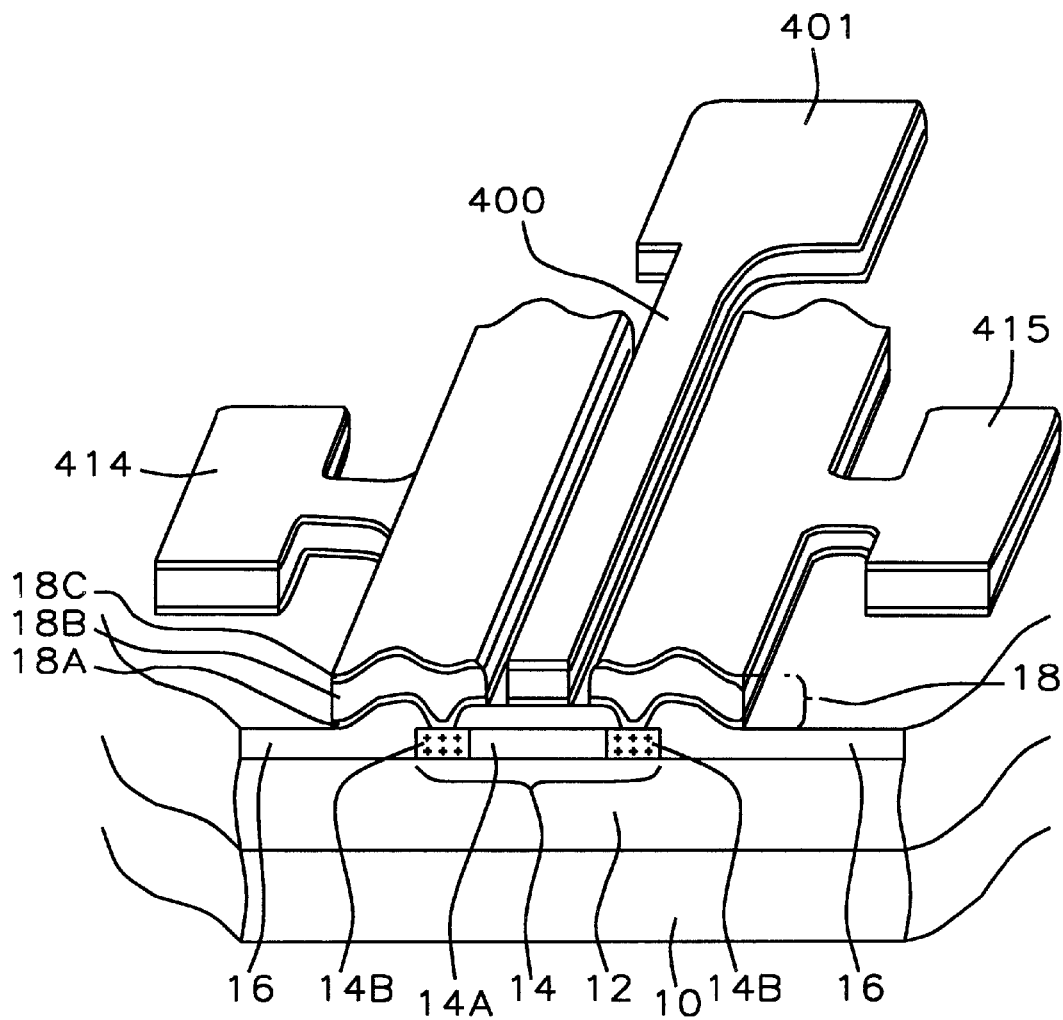
FIG. 4 is a cross sectioned isometric representation of the structure using deposited metal contacts to the intrinsic polysilicon sensor stripe. Both probe pads for the sensor and one for the EM test stripe are shown.

Referring now to FIG. 3, there is shown a typical embodiment of this invention in schematic form along with its measurement circuitry. The metal stripe 400 undergoing EM testing is connected between probe pads 401 and 402. Current is supplied to the stripe by power supply 420. The sensor 14, which lies below the EM metal stripe 400, and is insulated from it by a layer of silicon oxide, consists of a stripe of polysilicon having heavily doped lateral edges. Composite aluminum metallization is applied to the edges and forms an electrical connection between the stripe and the measurement probe contacts 414 and 415. The measurement probes are connected to instrumentation 421 which measures the resistance of the polysilicon sensor. For additional clarification of the structure, refer to FIG. 4 which is an isometric view with a cross-section of a portion of the sensor and the EM test stripe. The silicon oxide layer 12 on the silicon wafer 10 is the field oxide isolation used in the CMOS process. The polysilicon sensor stripe 14 consists of a central intrinsic portion 14a and heavily doped edge portions 14b.

The silicon oxide layer 16 which isolates the metal stripe 400 from the polysilicon sensor stripe 14 is derived from the oxide layer 16 which defines the contacts for the CMOS devices. The EM test stripe 400 structure consists of the barrier metallurgy 18a the aluminum/silicon alloy 18b and an anti-reflection coating of Ti, TiW, or TiN 18c deposited onto the stripe. The metallization which forms the lateral connections to the polysilicon sensor 14 and the probe contacts 414 and 415 is formed in the same process step as the metallization for the EM test stripe 400 and its probe contacts 401 and 402(the latter is not shown in FIG. 4).

FIG. 5 through FIG. 10, illustrate the fabrication process by which this embodiment is formed within the framework of a conventional self-aligned polysilicon gate CMOS manufacturing process. The cross section depicted in these figures is the same as that represented in FIG. 4.

Figure 5:
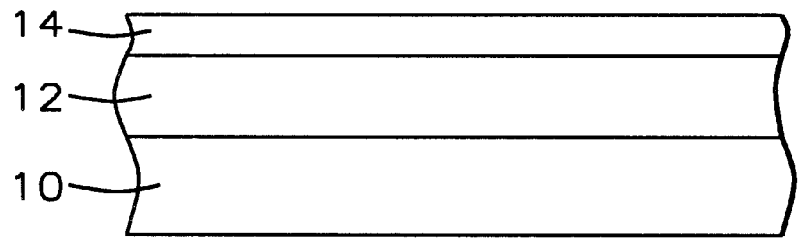
FIG. 5 through 11 are cross sections showing the fabrication of a polysilicon electromigration sensor and it's EM test metal stripe within the framework of process steps conventionally used for the formation of self-aligned polysilicon gate MOSFETs.

Referring now to FIG. 5, a substrate consisting of a p-type <100> oriented mono-crystalline silicon wafer 10 is provided. The wafer 10 contains CMOS devices formed within its surface which are enclosed by areas of silicon oxide field isolation 12. This embodiment is fabricated over such an area of field oxide 12. This area may be located in the wafer kerf or in a special manufacturing test site(MTS). A layer of intrinsic polycrystalline silicon(hereafter referred to as polysilicon)14 is then deposited using low-pressure-chemical-vapor-deposition between 600° and 650° C. in silane and hydrogen to a thickness between 1500 to 5000 Angstroms. This is the identical deposition used to form the gate electrodes for the product devices.

The next step requires a photoresist mask PRl to protect the active portion of the polysilicon sensor from ion implantation. Masking some areas of the polysilicon from the gate implant is not common to all CMOS processes although it is implemented in some SRAM(Static-Random-Access-Memory) procedures. Thus, this could be considered as an additional photolithographic step for the EM sensor fabrication.

Figure 6:
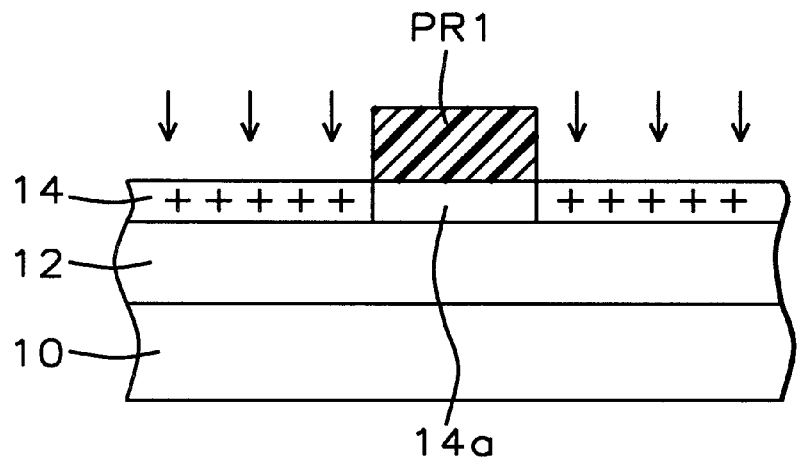
Figure 7:
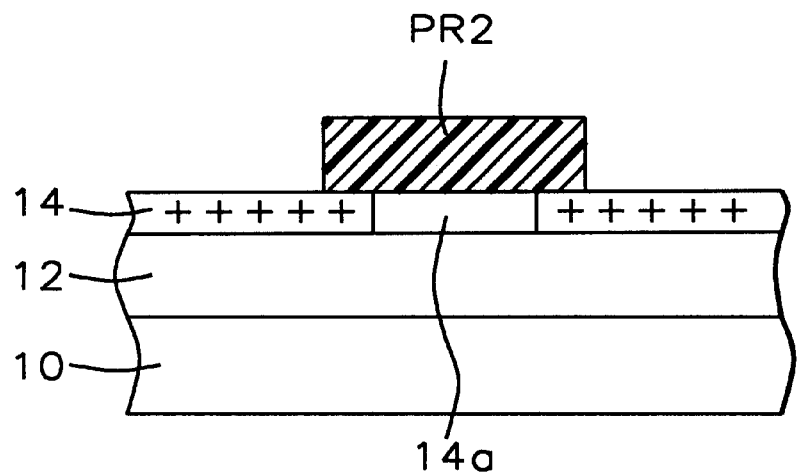

Using standard photolithographic techniques, the polysilicon layer is patterned to define a stripe between 1 to 4 microns wide and up to 10,000 microns long. The thickness of the polysilicon stripe is consistent with the thickness of the polysilicon gate used in the product and can be between 0.1 to 1 microns thick. FIG. 6 illustrates this photoresist mask PRl in position, defining the center intrinsic portion of the polysilicon stripe 14a.

Figure 8:
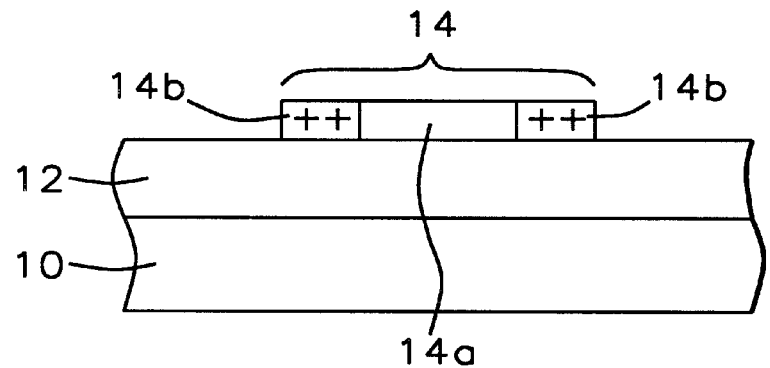

The gate ion implant is next performed using arsenic or phosphorous and the photoresist mask PRl is stripped in the conventional manner. A second layer of photoresist is applied and patterned to form the mask PR2. This mask defines the polysilicon gate of the product and also the entire polysilicon portion of the EM sensor FIG. 7. The exposed polysilicon is then etched away using reactive-ionetching (RIE) with chlorine/argon, leaving the stripe 14 which consists of the central intrinsic portion 14a and the doped edges 14b as depicted in FIG. 8. This step also forms the polysilicon gate structures of the product.

The CMOS processing continues with the p-channel source/drain implants while the n-channel devices are protected by photoresist. Then the n-channel devices are next implanted while the p-channel devices are protected by photoresist. The polysilicon EM sensor structure is shielded from these implants by photoresist. In some processes a silicon oxide sidewall is provided alongside the polysilicon gate prior to source/drain implant. The polysilicon sensor would also receive this sidewall but it would have no impact on its functionality.

Figure 9:
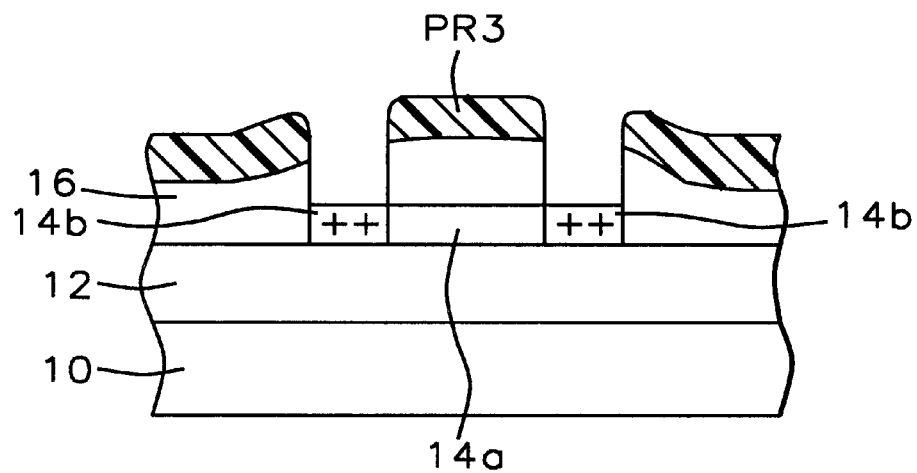
Figure 10:
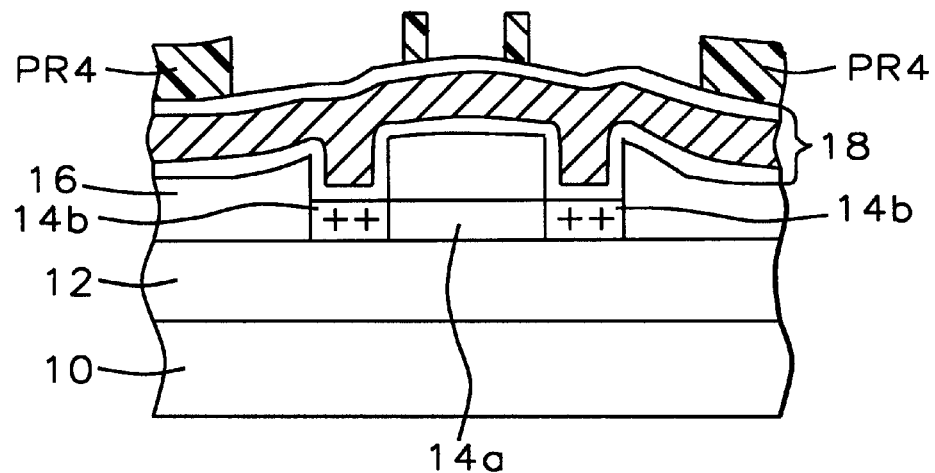

Referring now to FIG. 9, a layer of silicon oxide 16 is deposited using LPCVD. This is the layer which will contain the contact openings for the silicon devices and at the same time provide the insulation between the polysilicon EM sensor and the EM metal test stripe. In some processes it may be comprised of phosphosilicate glass(PSG) or of borophosphosilicate glass(BPSG). A layer of photoresist PR3 is deposited over silicon oxide layer 16 and patterned to define the access openings for the device contacts as well as expose the edges of the polysilicon EM sensor. These openings are then formed by reactive-ion-etching of the silicon oxide layer 16 using tetrafluoromethane($CF_4$).

Figure 11:
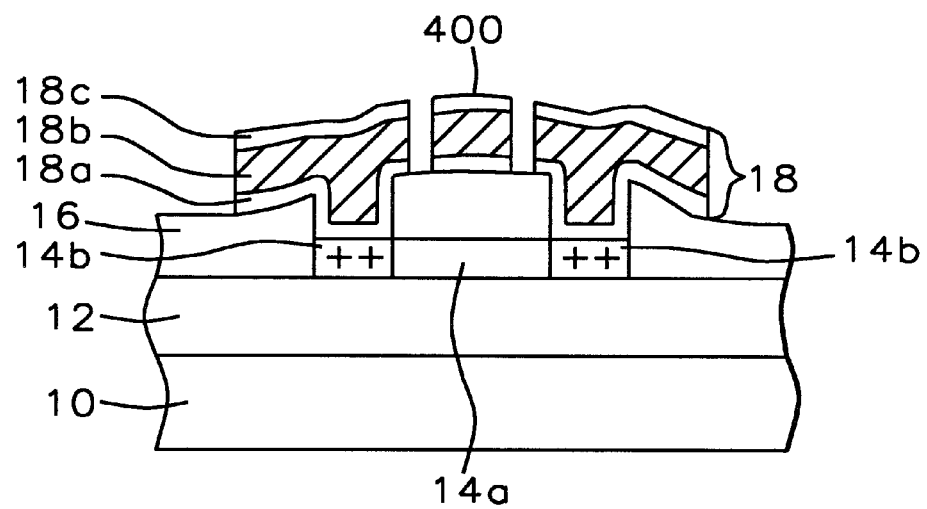

The metallization is next deposited by sputtering. The barrier metallurgy, consisting of a titanium layer followed by a titanium nitride layer, is deposited first. Then an aluminum/silicon/copper alloy is deposited. Finally a thin layer of Ti, TiW, or TiN is deposited over the aluminum alloy as an anti-reflection coating. These depositions are performed in a multi-target sputtering system so that the entire composite metallization is formed in a single pumpdown, thereby avoiding needless exposure to atmosphere. A layer of photoresist PR4 is applied and patterned over the metallization layer, and the metallization layer is etched by reactive-ion-etching to form the metallization for the devices, the contact to the polysilicon EM sensor, and the electromigration test stripe 400 itself (FIG. 11 and FIG. 4).

The metal stripe may now be tested for electromigration failure by applying probes to the probe pads 401, 402, 414 and 415. A fixed voltage is applied between pads 401 and 402 to provide a current consistent with predetermined stress conditions for the EM test stripe. The circuitry 421 then monitors the current vs time using a recording device.

The testing regimen depends upon the nature and severity of the electromigration exposure. Testing of EM stripes in the wafer kerf could be done at this point to determine if the wafer is to be scrapped or re-directed. Test specimens located on MTSs can be reserved for subsequent accelerated testing after the wafer is diced. In order to accomplish the later or to perform kerf testing at a later point in the process, the connections from the pads 401, 402, 414, and 415 must be propagated along the metallization hierarchy through vias to make them available for probing at the appropriate time.

The preceding embodiment was for a basic stand-alone EM test structure. Its compatibility with widely used conventional processes for the manufacture of products in the MOSFET family, in particular CMOS, makes it extremely useful as a process monitor. This compatibility is presently confined only to the first layer of metallization, although it is this layer where electromigration concerns are most prevalent. This EM test structure is able to detect electromigration failure of the aluminum alloy stripe in the presence of non-failing adjacent barrier metallization. The failure is obscured when direct testing of the metal stripe is used under these conditions. Test devices fabricated onto MTSs can be useful for reliability and parametric studies of product metallurgies.

The embodiments of FIGS. 4 through 11 used a P-substrate. It should be well understood by those skilled in the art that N-type substrate conductivities may also be used. It should be further understood that the substrate conductivity type as referred to here does not necessarily refer to the conductivity of the starting wafer but could also be the conductivity of a diffused region within a wafer.

While the invention has been particularly shown and described with reference to the preferred embodiments thereof, it will be understood by those skilled in the art that various changes in form and details may be made without departing from the spirit and scope of the invention.

What is claimed is:

1. A structure formed on a silicon wafer substrate to detect the onset and monitor the progress of electromigration in an adjacent metal test line, comprising:

(a) a wafer substrate having a first insulative layer;

(b) a polysilicon stripe, formed on said first insulative layer, having an intrinsic band disposed centrally between two impurity doped conductive bands, said conductive bands disposed laterally along the length of said intrinsic band:

(c) two metal bands, each one of said two metal bands having an attached probe pad and contacting, respectively, one of said two conductive bands along its full length: and (d) a metal stripe, having probe pads at each end, and having a central portion between said probe pads comprising a test line, disposed over and aligned in the same direction as said polysilicon stripe and insulated therefrom by a second insulative layer.

2. The structure of claim 1 wherein said metal stripe is up to 10,000 microns long between probe pads, between 0.1 and 2.0 microns wide and between 0.1 and 1.0 microns thick.

3. The structure of claim 1 wherein said polysilicon stripe is between about 1 and 2 microns wider than said metal stripe.

4. The structure of claim 1 wherein the resistivity of said intrinsic band is no less than 100 ohm cm. at 25° C.

5. The structure of claim 1 wherein the first insulating layer is a field oxide isolation layer and is between 3000 and 5000 Angstroms thick.

6. The structure of claim 5 wherein the metal stripe comprises a first layer of titanium, a second layer of titanium nitride, a third layer of an aluminum-silicon-copper alloy and a fourth layer selected from the group consisting of titanium, titanium-tungsten alloy, and titanium nitride.

7. The structure of claim 1 wherein said second insulating layer is silicon oxide and is between 6000 and 10,000 Angstroms thick.

8. The structure of claim 1 wherein the second insulating layer is a phosphosilicate glass and is between 6000 and 10,000 Angstroms thick.

9. The structure of claim 1 wherein the second insulating layer is a borophosphosilicate glass and is between 6000 and 10,000 Angstroms thick.

10. The structure of claim 1 wherein the metal stripe is an aluminum-silicon-copper alloy.

11. The structure of claim 1 wherein the metal stripe comprises a first layer of titanium, a second layer of titanium nitride, and a third layer of an aluminum silicon-copper alloy.

* * * * *